United States Patent [19]

Nakaigawa

[11] Patent Number: 5,459,411
[45] Date of Patent: Oct. 17, 1995

[54] WIRED-OR LOGIC CIRCUITS EACH HAVING A CONSTANT CURRENT SOURCE

[75] Inventor: Sachio Nakaigawa, Tokyo, Japan

[73] Assignee: NEC Corporation, Tokyo, Japan

[21] Appl. No.: 36,949

[22] Filed: Mar. 25, 1993

[30] Foreign Application Priority Data

Mar. 26, 1992 [JP] Japan ................................ 4-067847

[51] Int. Cl.$^6$ ..................... H03K 19/082; H03K 19/20; H03K 19/086
[52] U.S. Cl. ..................... 326/21; 326/125; 326/126; 326/90; 326/59
[58] Field of Search ...................... 307/443, 445, 307/455, 475, 473; 326/125, 126, 89–90, 56, 75, 21, 30

[56] References Cited

U.S. PATENT DOCUMENTS

| | | | |
|---|---|---|---|
| 4,713,560 | 12/1987 | Herndon ................................ | 307/455 |
| 4,999,519 | 3/1991 | Kitsukawa et al. ...................... | 307/443 |
| 5,093,587 | 3/1992 | Zbinden . | |
| 5,162,677 | 11/1992 | Takahashi ............................... | 307/475 |
| 5,274,277 | 12/1993 | Chan ........................................ | 307/443 |
| 5,291,075 | 3/1994 | Hollstein et al. ........................ | 307/473 |

FOREIGN PATENT DOCUMENTS 3-220816  9/1991  Japan ..................................... 307/455

OTHER PUBLICATIONS

Patent Abstracts of Japan, vol. 5, No. 181 (E–83) (853) 20 Nov. 1981; & JP–A–56 107 641 (Nippon Denki K.K.) 26 Aug. 1981 *abstract*.

Patent Abstracts of Japan, vol. 12, No. 486 (E–695) 19 Dec. 1988; & JP–A–63 200 617 (Mitsubishi Electric Corp.) 18 Aug. 1988 *abstract*.

Patent Abstracts of Japan, vol. 8, No. 139 (E–253) 28 Jun. 1984 & JP–A–59 047 842 (Nippon Denki K.K.) 17 Mar. 1984 *abstract*.

Patent Abstracts of Japan, vol. 13, No. 407 (E–818) 8 Sep. 1989 & JP–A–01 147 915 (Hitachi Ltd.) 9 Jun. 1989 *abstract*.

*Primary Examiner*—Edward P. Westin
*Assistant Examiner*—Jon Santamauro
*Attorney, Agent, or Firm*—Whitham, Curtis, Whitham & McGinn

[57] ABSTRACT

A wired-OR logic circuit has a plurality of logic circuit connected to a common signal line. Each of the plurality of logic circuits includes an output bipolar transistor for outputting a logical output signal to the common signal line, and a constant-current source forming an emitter-follower circuit together with tile output bipolar transistor and being turned-on or turned-off in response to an output select signal. Each of the logic circuits may include a base potential setting circuit which applies different base potentials to a base of the output bipolar transistor. The outputs of the same level from all the logic circuits can be outputted to an output terminal without being influenced by voltage drops caused by distributed wiring resistances inherently existing in the signal line.

3 Claims, 5 Drawing Sheets

WIRED-OR LOGIC CIRCUITS EACH HAVING A CONSTANT CURRENT SOURCE

BACKGROUND OF THE INVENTION

1. Field of the Invention

The present invention relates to a wired-OR logic circuit, and more particularly to a wired-OR logic circuit constituted by a plurality of logic circuits each of which outputs a logic signal through an emitter-follower bipolar transistor.

2. Description of the Related Art

An example of a conventional wired-OR logic circuit of the kind to which present invention relates is shown in FIG. 1. As shown therein, the wired-OR logic circuit includes a plurality (n) of logic circuits $L_1-L_n$ which are selected by output select signals $E_1-E_n$ (wherein n is an integer). An emitter of each of signal output transistors $T_1-T_n$ in such logic circuits is an output terminal of each of such logic circuits, and each of outputs $Q_1$ $_{-Qn}$ is outputted to a common output terminal 3 through the same signal line 2 having distributed wiring resistances $r_1-r_{n-1}$. The signal line 2 is connected to a low potential power source 5 of the lowest potential through a constant-current source 4 common to tile plurality of logic circuits $L_1-L_n$.

The operation of the above conventional wired-OR logic circuit is now explained. First, an output $Q_m$ of m'th logic circuit $L_m$ (where m is an integer of $1 \leq m \leq n$) selected may take a state of high level (hereinafter referred to as "$V_H$") or a state of low level (hereinafter referred to as "$V_L$"). Outputs of other non-selected logic circuit are fixed to the low level $V_L$. Since the outputs of the logic circuits are in a wired-OR connection, a high level signal or a low level signal corresponding to an output $Q_m$ of the logic circuit $L_m$ is outputted to the output terminal 3.

Now, assuming that the n'th logic circuit $L_n$ is selected and all the other remaining logic circuits are non-selected, a voltage value $V_{OUT}$ appearing at the output terminal 3 as an output $Q_n$ of the logic circuit $L_n$ is substantially $V_{OUT}=V_H$ or $V_{OUT}=V_L$ since the value is not influenced by the distributed wiring resistances $r_1-r_{n-1}$.

Next, assuming that the first logic circuit $L_1$ which is farthest from the output terminal 3 is selected and all the other remaining logic circuits are non-selected, a voltage value $V_{OUT}$ appearing at the output terminal 3 becomes $V_{OUT}=V_H-(r_1+r_2+ \ldots +r_{n-1}) \cdot I$ or $V_{OUT}=V_L-(r_1+r_2+ \ldots +r_{n-1}) \cdot I$ (wherein I is a current value of the constant-current source 4) according to an output state of the logic circuit $L_1$ due to a voltage drop since the path through which the current flows then is from the collector to the emitter of the transistor $T_1$, through the distributed wiring resistances $r_1, r_2, \ldots, r_{n-1}$ and from the constant-current source 4 to the lowest potential power source 5.

Generally, when the m'th logic circuit $L_m$ is selected by the output select signal $E_m$ and the logic signal inputted to the base of the output transistor $T_m$ within the logic circuit $L_m$ is outputted as an output signal of the logic circuit $L_m$ from the emitter of the transistor $T_m$ through the output terminal 3, the voltage value $V_{OUT}$ at the output terminal 3 becomes $V_{OUT}=V_H-(r_m+r_{m+1}+ \ldots +r_{n-1}+r_n) \cdot I$ or $V_{OUT}=V_L-(r_m+r_{m+1}+ \ldots +r_{n-1}+r_n) \cdot I$ in accordance with an output state of the relevant logic circuit $L_m$ since the current passes through the collector and the emitter of the transistor $T_m$ and through the distributed wiring resistances $r_m, r_{m+1}, r_{n-1}, r_n$ (wherein, for the sake of simplicity, $r_n=0$) and then flows from the constant-current source 4 into the lowest potential power source 5.

In the conventional wired-OR logic circuit described above, a number of logic circuits share a common signal line 2 and a constant-current source 4 and it is so arranged that outputs $Q_1-Q_n$ from the respective logic circuits are switched by the output select signals $E_1-E_n$. Consequently, even where the outputs $Q_1-Q_n$ themselves of the logic circuits $L_1-L_n$ are of the same signal level all through, the output signal level $V_{OUT}$ out from the logic circuit $L_1$ whose wiring length from the constant-current source 4 becomes long suffers a voltage drop due to distributed wiring resistances in the signal line 2. The voltage drop when compared with the output signal level from the output $Q_n$ of the logic circuit $L_n$ which is nearest to the constant-current source 4 will be in the amount or level of $(r_1+r_2+ \ldots +r_{n-1}) \cdot I$. As a result, there is a possibility that, in some occasions, the sufficient signal level, e.g., the minimum signal level, required for the next stage cannot be obtained by the conventional wired-0R logic circuit. This is a problem to be solved by the invention, in the conventional wired-OR logic circuit.

SUMMARY OF THE INVENTION

It is, therefore, an object of the present invention to overcome the problem explained above and to provide an improved wired-OR logic circuit in which output signals from the respective logic circuits constituting the wired-OR logic circuit are maintained at the same level irrespective of differences in the lengths of wirings to the common output terminal and which allows wide operational margins.

According to one aspect of the invention, there is provided a wired-OR logic circuit having a plurality of logic circuits connected to a common signal line in a wired-OR form each of the plurality of logic circuits comprising:

an output bipolar transistor for outputting a logical output signal to the common signal line; and a constant-current source which forms an emitter-follower circuit together with the output bipolar transistor and which is turned-on or turned-off in response to an output select signal.

It is preferable that each of the logic circuits comprises a circuit for causing an output signal level during a non-selected mode to become lower than a low level of the output logical signal during a selected mode.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are hereinafter explained with reference to the accompanying drawings.

Figure 1:
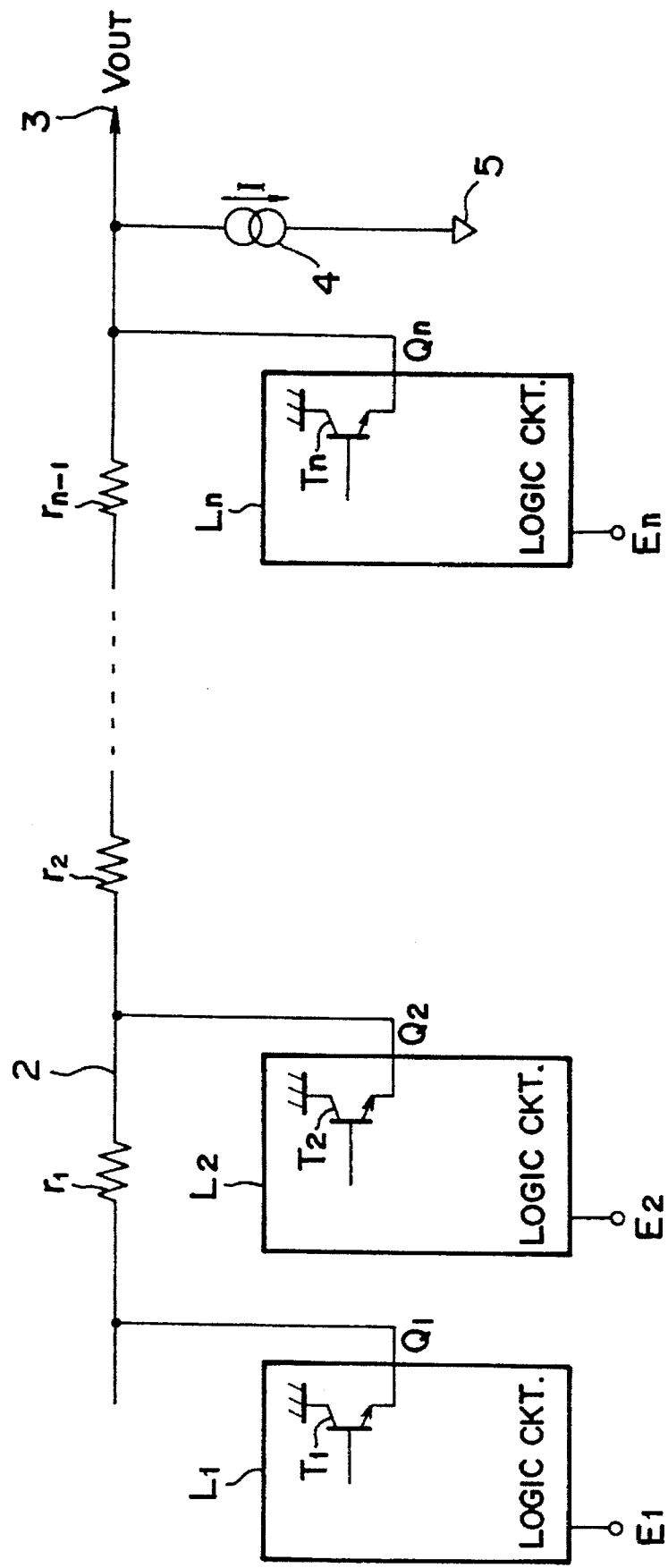
FIG. 1 is a block diagram showing a conventional wired-OR logic circuit.
Figure 2:
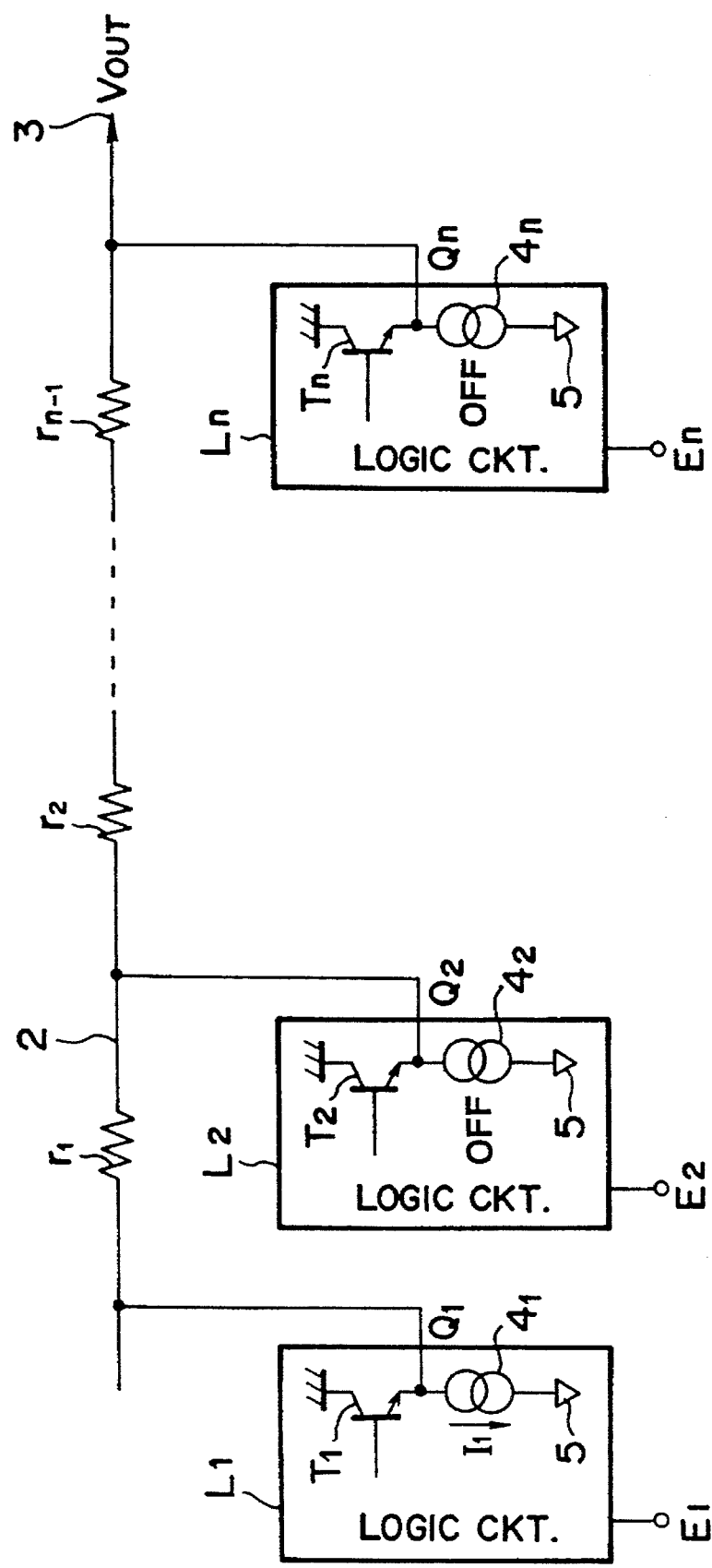
FIG. 2 is a block diagram showing an arrangement according to a first embodiment of the invention.

FIG. 2 is a block diagram showing an arrangement according to a first embodiment of the invention. In FIG. 2, elements or portions corresponding to those in FIG. 1 showing the conventional wired-OR logic circuit are denoted by the same or similar references. In the arrangement shown in FIG. 2, the difference when compared with the conventional arrangement shown in FIG. 1 is that, whereas the constant-current source 4 is common to all the logic circuits $L_1$–$L_n$ in tile conventional arrangement, the constant-current sources $4_1$–$4_n$ are provided respectively between the emitters of the output bipolar transistors $T_1$–$T_n$ and the low potential power sources 5 in each of the logic circuits $L_1$–$L_n$. These constant-current sources $4_1$–$4_n$ are switched ON and OFF, respectively, in accordance with states of the output select signals $E_1$–$E_n$ and constitute emitter-follower circuits together with the output bipolar transistors $T_1$–$T_n$.

Now, the operation of circuit arranged as above is explained. In FIG. 2, if only the output select signal $E_1$ is selected and all the other output select signals $E_2$–$E_n$ are in "non-selected" modes, the constant-current source $4_1$ becomes ON at the same time as the logic circuit $L_1$ is selected and the constant-current $I_1$ flows accordingly. On the other hand, the constant-current sources $4_2$–$4_n$ within the logic circuits $L_2$–$L_n$ which are in "non-selected" modes turn OFF, so that no current flows therein. Generally, where the output select signal $E_m$ (wherein m is an integer of $1 \leq m \leq n$) is selected, the constant-current source $4_m$ within the logic circuit $L_m$ becomes ON, but all the other constant-current sources are in OFF states so that no current flows therein. In this case, the current $I_m$ flows passing from tile collector to the emitter of the bipolar transistor $T_m$ and to tile low potential power source line 5 through the constant-current source $4_m$, so that no voltage drop is caused by the distributed wiring resistances inherently existing in the signal line 2.

Figure 3:
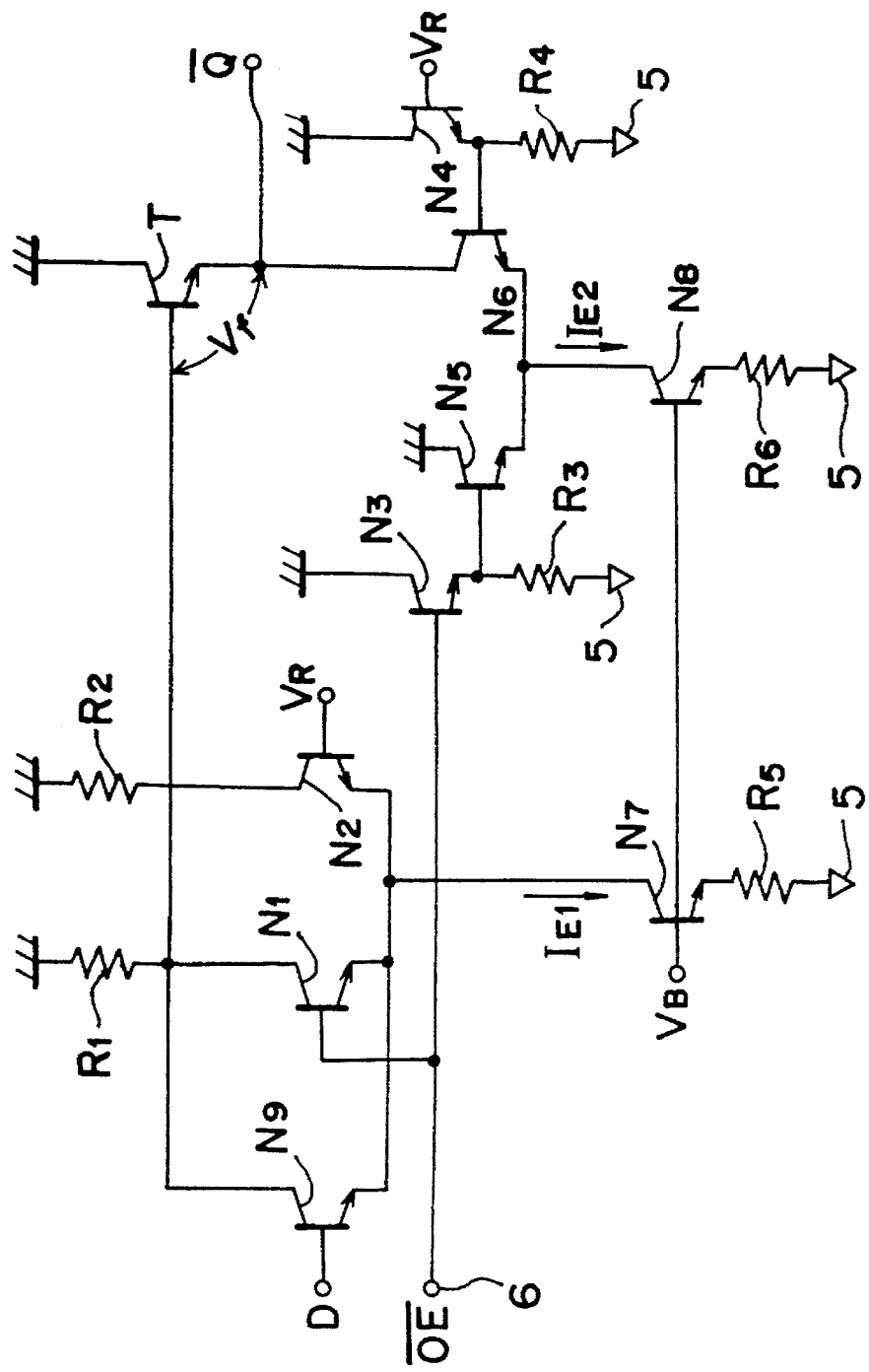
FIG. 3 is a circuit diagram showing the logic circuit of the first embodiment in a transistor level.

FIG. 3 is a circuit diagram showing, in a transistor level, the arrangement of the logic circuit shown by block in FIG. 2 with a logic circuit of an emitter-coupled logic (ECL) type being used as an example.

In this embodiment, when a level at an output select terminal 6 is high with respect to an input reference voltage $V_R$, that is, in the case of tile "non-selected" mode, since the base potential of a transistor $N_3$ is higher than the reference voltage $V_R$, tile base potential of a transistor $N_5$ becomes higher than the base potential of a transistor $N_6$, so that the transistor $N_5$ turns ON and the transistor $N_6$ turns OFF. Consequently, there is no flow of current between the emitter of an output transistor T and the collector of the transistor $N_6$ with the state being the same as that when tile constant-current source is in an OFF state. Also, in this "non-selected" mode, since the base potential of a transistor $N_1$ is higher than the base potential of a transistor $N_2$ which receives at its base the reference voltage $V_R$, the transistor $N_1$ turns ON and the current $I_{E1}$ flows in a resistor $R_1$. At this time, assuming that the potential across the base and emitter of the output transistor T is $V_f$, the potential of tile output $\bar{Q}$ becomes $V_{\bar{Q}} = -(R_1 \cdot I_{E1} + V_f)$ and becomes a low level.

Next, contrary to tile above, if the level at the output select terminal 6 is low, that is, in the case of the "selected" mode, since the emitter potential of the transistor $N_4$ is higher than that of the transistor $N_3$, the base potential of the transistor $N_6$ is higher than that of the transistor $N_5$ so that the transistor $N_6$ turns ON and the transistor $N_5$ turns OFF. Consequently, the current $I_{E2}$ flows from the emitter of the transistor T to the collector of the transistor $N_6$. Also, in this "selected" mode, since the base potential of the transistor $N_1$ is lower than the base potential (reference voltage $V_R$) of the transistor $N_2$, the path for the current $I_{E1}$ changes according to a value of an input D which is the base voltage of the transistor $N_9$. That is, the transistor $N_9$ turns ON when a high level potential is inputted to the input terminal D and, at this time, the current $I_{E1}$ flows from a ground line, passes through the resistor $R_1$ and then flows from the collector to the emitter of the transistor $N_9$. Thus, as the base potential of the transistor T becomes $-(R_1 \cdot IE_1)$, the potential $\bar{Q}$ at the output node is low and becomes $-(R_1 \cdot I_{E1} + V_f)$. On the other hand, when the input D is low, the current $I_{E1}$ flows from the ground line, passes through the resistor $R_2$ and then flows from the collector to the emitter of the transistor $N_2$. Thus, since no current flows in the resistor $R_1$, the base potential of the transistor T equals the ground potential and, thus, the output potential $\bar{Q}$ is high with the potential of $-V_f$ being outputted.

Figure 4:
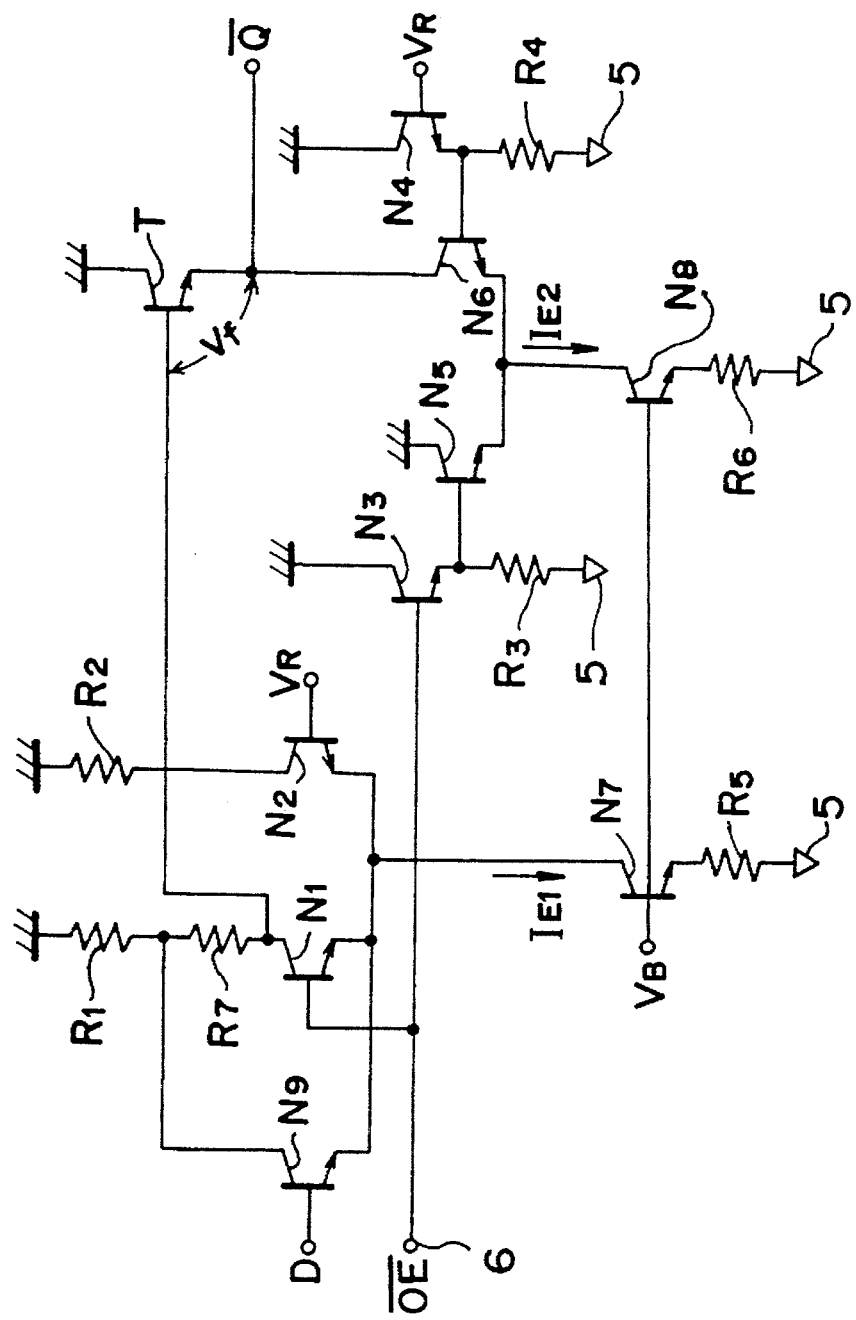
FIG. 4 is a circuit diagram showing tile logic circuit of a second embodiment in a transistor level.

Next, a second embodiment according to the invention is explained. FIG. 4 is a circuit diagram showing the logic circuit of the second embodiment in a transistor level. As is seen in FIG. 4, the logic circuit according to this second embodiment is different from that according to the first embodiment shown in FIG. 3 in the point wherein, in the former, there is inserted a resistor $R_7$ in addition to the resistor $R_1$ between the collector of the transistor $N_9$ and the ground line, and the collector of the transistor $N_9$ is connected with the common junction node of the transistors $R_1$ and $R_7$. According to this embodiment, as in the above first embodiment, when the output select terminal 6 is high ("non-selected" mode), the transistor $N_5$ turns ON and the transistor $N_6$ turns OFF, so that no current flows from the emitter of the transistor T to the collector of the transistor $N_6$. At this time, if the transistor $N_1$ turns ON, the current $I_{E1}$ flows in the resistors $R_1$ and $R_7$ so that, assuming that the potential across the base and emitter of the transistor T is $V_f$, the output potential $\bar{Q}$ becomes $V_{\bar{Q}} = -\{(R_1 + R_7) \cdot I_{E1} + V_f\}$. That is, the potential of the output $\bar{Q}$ is lower by the magnitude or level of the $-(R_7 \cdot I_{E1})$ as compared with the first embodiment in which the resistor $R_7$ is not provided.

It should be noted that tile resistor $R_2$, the series resistors $R_1$ and $R_7$, and the transistors $N_1$, $N_2$ and $N_9$ constitute a base potential setting circuit for supplying different base potentials to a base of the output bipolar transistor T by selecting a first and a second current path in accordance with a state of the input signal D and also a state of the output select signal $\overline{OE}$.

Figure 5A:
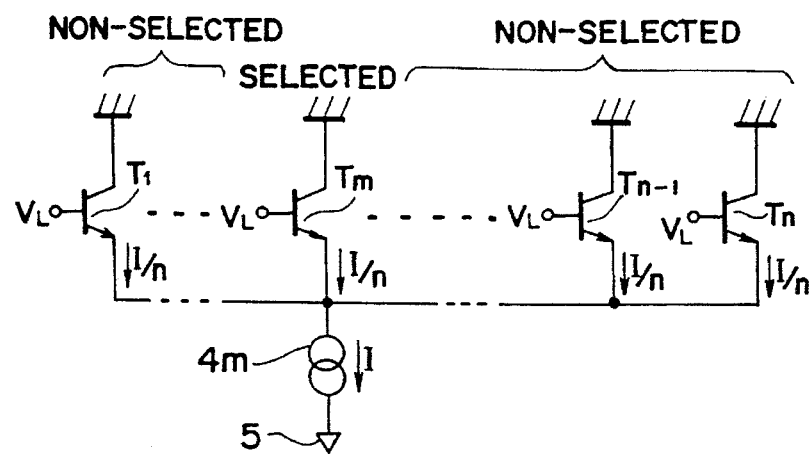
FIGS. 5A and 5B are diagrams for illustrating output states of logic circuits.
Figure 5B:
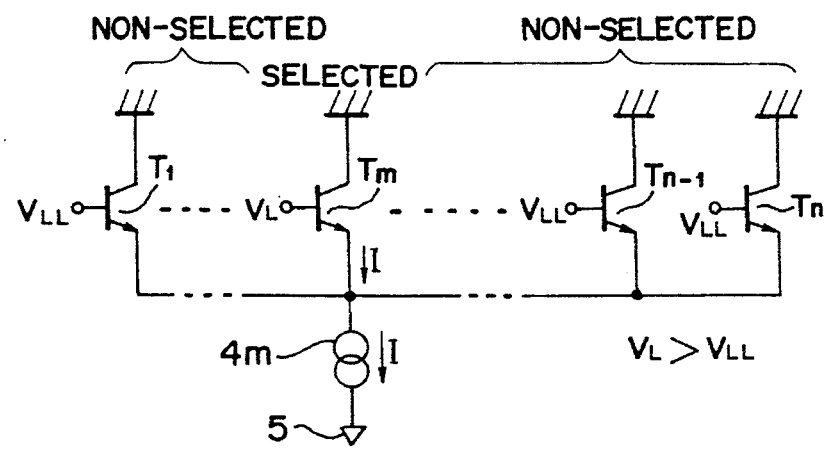
Figure 5C:
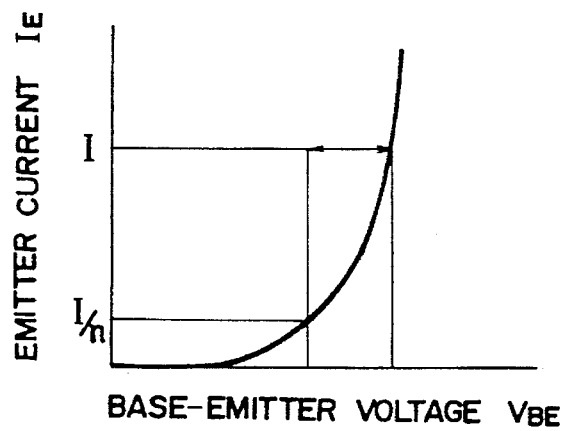
FIG. 5C is a graph showing $I_E-V_{BE}$ characteristics of the output bipolar transistor, for explaining effects of the second embodiment.

In the first embodiment, the output $\bar{Q}$ of the logic circuit under the "non-selected" mode is fixed to a low level which is the same low level as the low level of the output $\bar{Q}$ of the logic circuit under the "selected" mode so that, as shown in FIG. 5A, a current path is formed in each of the logic circuits. This means that, as can be appreciated from the emitter current vs. base-emitter voltage ($I_E$–$V_{BE}$) characteristics of a transistor shown in FIG. 5C, the emitter current is reduced whereby the potential difference across the base and emitter of the transistor becomes small. That is, the voltage $V_f$ across the base and emitter of the transistor concerned in FIGS. 3 and 4 decreases and a low level of the output $\bar{Q}$ rises. On the other hand, according to this second embodiment, since the potential $V_{LL}$ of the output $\bar{Q}$ of the logic circuit under the "non-selected" mode is caused to be lower than the low level potential $V_L$ of the logic circuit under the "selected" mode, no current flows to the emitter of the output transistor under the "non-selected" mode as shown in FIG. 5B and, thus, the low level of the output $\bar{Q}$ of the logic circuit under the "non-selected" mode becomes the output level of the entire circuit. This allows a larger operational margin.

As explained above, according to the invention, a constant-current source together with an output bipolar transistor forming an emitter-follower circuit is provided in each of a plurality of logic circuits constituting a wired-OR logic circuit. This constant-current source is so constructed as to allow the current to flow only when the logic circuit to which it belongs is selected.

According to the invention, when an output signal from among a plurality of logic circuits is outputted to a common signal line after being switched by output select signals, the necessary constant-current source is selected in response to such output signals and the current is allowed to flow only to the emitter-follower circuit for the selected logic circuit, so that the outputs of the same level from all of the logic circuits can be outputted to the output terminal without being influenced by voltage drops caused by distributed wiring resistances in the signal line from any of the logic circuits to the output terminal.

Furthermore, by providing, in each of the logic circuits constituting a wired-OR logic circuit, a circuit which causes the output signal level under the "non-selected" mode to become lower than the low level of the output signal under the "selected" mode, the low level of the output signal from the selected logic circuit can be prevented from rising and this allows to widen the operational margin of the circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A wired-OR logic circuit having a plurality of logic circuits connected to a common signal line in a wired-OR form, each of said plurality of logic circuits comprising:

an output bipolar transistor for outputting a logical output signal to said common signal line; and a constant-current source which forms an emitter-follower circuit together with said output bipolar transistor and which is turned-on or turned-off in response to an output select signal, each of said plurality of logic circuits comprises a base potential setting circuit for supplying different base potentials to a base of said output bipolar transistor by selecting a first and a second current path in accordance with a state of an input signal applied to the logic circuit and also a state of the output select signal, said base potential setting circuit includes a circuit for causing an output signal level in a non-selected mode in response to a first level of said output select signal to become lower than a low level of the output logical signal in a selected mode in response to a second level of said output select signal.

2. A logic circuit comprising:

an output transistor connected between a constant-potential node and an output terminal, for driving said output terminal in accordance with a level of an internal signal;

a constant-current source, connected to said output transistor, said constant current source being activated in response to a control signal of a first logic level so as to provide a predetermined current to said output transistor and being deactivated in response to said control signal of a second logic level; and an input circuit having an input node to which an input signal is applied and an output node which is connected to a base of said output transistor, for producing said internal signal, said input circuit being activated in response to said control signal of the first logic level so that said internal signal of a first level or a second level is produced in accordance with a level of said input signal, and said input circuit being deactivated in response to said control signal of the second logic level so that, irrespective of the level of said input signal, said internal signal is fixed to a third level which is different from both the first and second levels.

3. A logic circuit according to claim 2, wherein said input circuit comprises first, second and third current paths each having a resistor, and a selection circuit for selecting one of said first, second and third current paths so that said internal signal of one of said first, second and third levels is outputted to said output node.

\* \* \* \* \*